United States Patent
Deng et al.

(10) Patent No.: US 7,429,881 B2
(45) Date of Patent: Sep. 30, 2008

(54) WIDE INPUT COMMON MODE SENSE AMPLIFIER

(75) Inventors: Chaodan Deng, Portland, OR (US);
Songmin Kim, Beaverton, OR (US);
Navindra Navaratnam, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 148 days.

(21) Appl. No.: 11/326,952

(22) Filed: Jan. 6, 2006

(65) Prior Publication Data
US 2007/0159215 A1    Jul. 12, 2007

(51) Int. Cl.
*G11C 7/00* (2006.01)
(52) U.S. Cl. ............................. 327/52; 327/333; 326/81
(58) Field of Classification Search .................. 326/62, 326/63, 68, 80, 81; 327/51–53, 55, 333
See application file for complete search history.

(56) References Cited

U.S. PATENT DOCUMENTS

| | | | | |
|---|---|---|---|---|
| 5,218,246 A | * | 6/1993 | Lee et al. ....................... 326/55 |
| 5,267,270 A | * | 11/1993 | Miyashita et al. ............ 375/318 |
| 5,319,348 A | * | 6/1994 | Lee et al. .................. 340/146.2 |
| 5,434,717 A | * | 7/1995 | Yoshinaga et al. ............. 360/46 |
| 6,359,473 B1 | * | 3/2002 | You et al. ...................... 327/52 |
| 6,525,608 B2 | | 2/2003 | Krupnik | |
| 6,628,168 B2 | | 9/2003 | Martin et al. | |
| 6,791,412 B2 | | 9/2004 | Griffin | |

* cited by examiner

*Primary Examiner*—N. Drew Richards
*Assistant Examiner*—William Hernandez
(74) *Attorney, Agent, or Firm*—Blakely, Sokoloff, Taylor & Zafman LLP

(57) ABSTRACT

According to embodiments of the subject matter disclosed in this application, a wide input common mode sense amplifier may include a level shifter stage and an amplifier stage. The level shifter comprises a CMOS differential amplifier that has a rail-to-rail input common mode range. The level shifter accepts two input signals with a common mode voltage in a rail-to-rail range and produces two output signals with a stable common mode voltage. The differential amplifier amplifies the two output signals from the level shifter stage with high gain. The disclosed sense amplifier may be used to measure delay between two discrete time events.

21 Claims, 8 Drawing Sheets

WIDE INPUT COMMON MODE SENSE AMPLIFIER

BACKGROUND

1. Field

This disclosure relates generally to electronic circuits, and, more specifically but not exclusively, to differential amplifiers.

2. Description

Differential amplifiers are ubiquitous building blocks in many electronic systems. In a differential amplifier, relevant information is represented by a difference between two signals. The differential amplifier amplifies the difference between two signals, but rejects common components ("common mode") of the two signals. Because of this characteristic, a differential amplifier is insensitive to power supply noise and device process variations so long as there is a good match between major devices. Mismatch between the major devices will cause the performance of a differential amplifier to degrade. In practice, however, an ideal match between the major devices is very difficult to achieve, if not impossible, because of random process variations.

In a differential amplifier, common mode voltages of both input signals and output signals may be represented by the average of two input signals and two output signals, respectively. The common mode voltage range is limited by two power rail voltages, supply voltage ("Vcc") and substrate voltage ("Vss"). In reality, the common mode voltage can rarely shift freely from one power rail voltage to another power rail voltage ("rail-to-rail") because of such factors as voltage headroom consumed by other devices (e.g., the current source and the source coupled devices). A limited common mode voltage range in turn limits applications of a differential amplifier. For example, when a differential amplifier is used as a sense amplifier, it is desirable for the amplifier to have minimum variations of speed and gain over the rail-to-rail input common mode range.

For the reasons stated above, and for other reasons stated below which will become apparent to those skilled in the art upon reading and understanding the present application, there is a need to have a wide common mode amplifier with low power consumption and little performance degradation against random process variations among devices.

BRIEF DESCRIPTION OF THE DRAWINGS

The features and advantages of the disclosed subject matter will become apparent from the following detailed description of the subject matter in which.

DETAILED DESCRIPTION

According to embodiments of the subject matter disclosed in this application, a wide input common mode sense amplifier may include a level shifter and a differential amplifier. The level shifter comprises a differential amplifier that has a rail-to-rail input common mode range but has a very small common mode gain. The level shifter accepts two input signals with any common mode voltage and produces two output signals with a stable common mode voltage. The differential amplifier accepts the two output signals as input signals. Because the input common mode voltage is stable and can be determined, the differential amplifier can be designed to have a high gain to compensate for the low gain of the level shifter. Furthermore, the level shifter stage of the sense amplifier has longer channel length and width than the differential amplifier stage to reduce the effects of in-die variation offset voltage.

Additionally, because the sense amplifier according to embodiments of the disclosed subject matter has a rail-to-rail input common mode range, the sense amplifier may be used to accurately measure delay between two discrete time events. For example, the sense amplifier may be used to measure the edge rate of a signal.

Reference in the specification to "one embodiment" or "an embodiment" of the disclosed subject matter means that a particular feature, structure or characteristic described in connection with the embodiment is included in at least one embodiment of the disclosed subject matter. Thus, the appearances of the phrase "in one embodiment" appearing in various places throughout the specification are not necessarily all referring to the same embodiment.

Figure 1B:
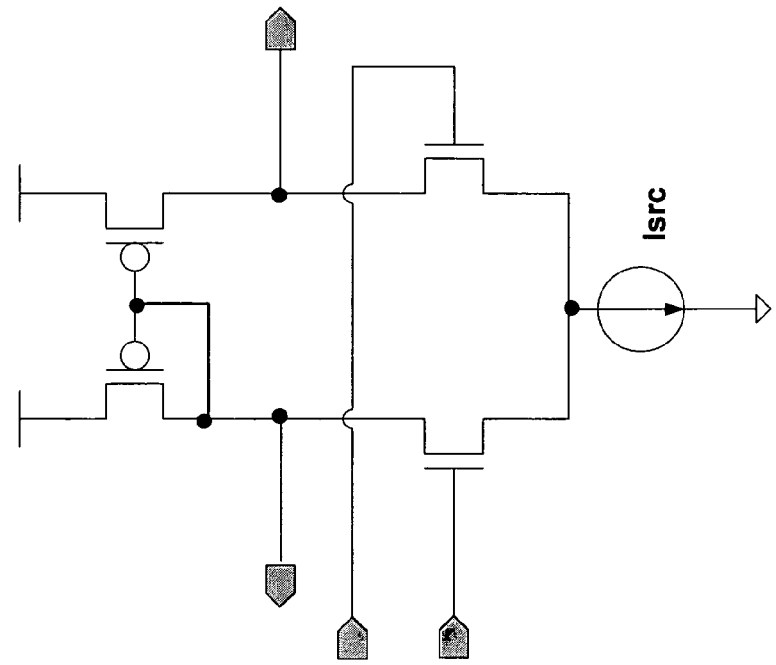
FIGS. 1A and 1B depict basic differential amplifier circuits.
Figure 1A:
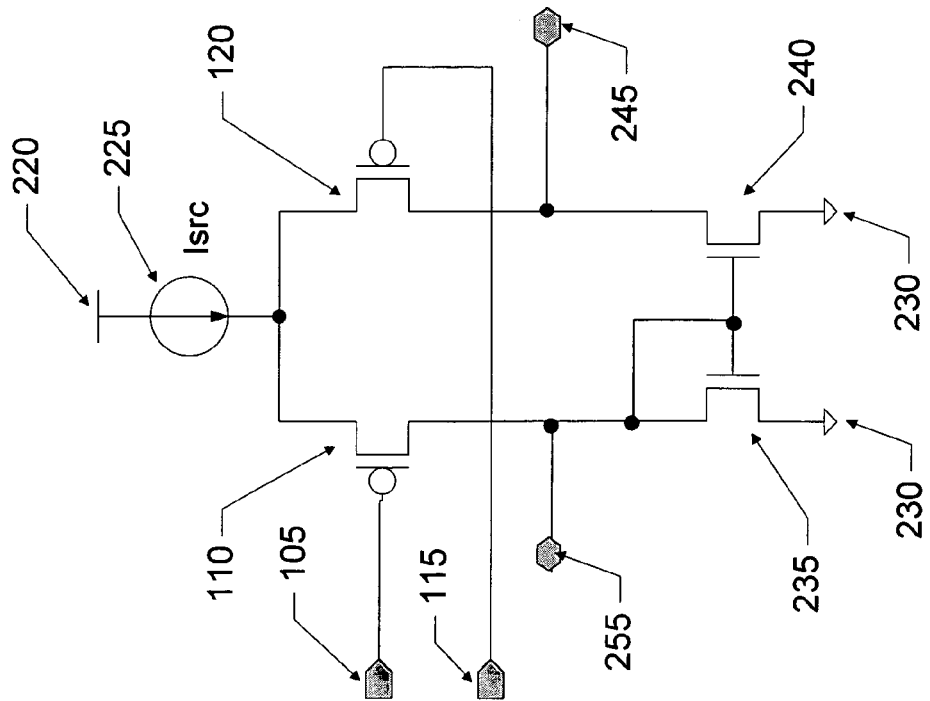

FIGS. 1A depicts a positive metal oxide semiconductor ("PMOS") input self-biased differential amplifier ("PSDA") circuit. Input ports 105 and 115 receive differential input voltage. A differential output voltage is provided by output ports 245 and 255. Transistors 110 and 120 are PMOS field effect transistors ("PMOSFETs") comprising a differential pair. Current source 225 is coupled to Vcc and sinks bias currents from transistor 110 and 120. Transistors 235 and 240 are two N-type metal oxide semiconductor field effect transistors ("NMOSFETs"), and are active loads with their drains connected to drains of transistor 110 and 120, respectively. The sources of transistor 235 and 240 are connected to Vss.

FIG. 1B depicts an NMOS input self-biased differential amplifier ("NSDA") circuit. Compared to a PSDA, the NSDA uses two NMOSFETs for the differential pair. The gates of the NMOSFETs pair are coupled to input ports and their drains is coupled to output ports. The current source is coupled between sources of the differential pair NMOSFETs and Vss to sink bias current from the differential pair NMOSFETs. A pair of PMOSFETs are used as active loads with their drains connected to drains of the NMOSFET pair, respectively.

For both the PSDA and the NSDA, the input common mode is limited by the voltage headroom consumed by the current source and the source coupled devices to ensure these devices are not operating in the cut-off or linear region. Thus, at an extreme high or low input common mode voltage, the gain and delay performance of the amplifier degrades. The PSDA amplifier stops functioning as a sense amplifier when the input common mode is operated close to Vcc. The gain and delay also degrade at a very low input common mode voltage since the source coupled devices will be forced into the linear operation region.

Input stages of an NSDA and a PSDA may be combined to form a complementary MOS ("CMOS") input self-biased differential amplifier ("CSDA"). A CSDA can provide a much wider input common mode range. However, a CSDA still does not address the issue associated with very high and very low input common-mode voltages since its common mode range is fundamentally limited by the voltage headroom consumed to operate the current sources and the source coupled devices away from the cut-off region. Thus, a CSDA is not a good choice for a very wide common-mode sense amplifier.

Figure 2:
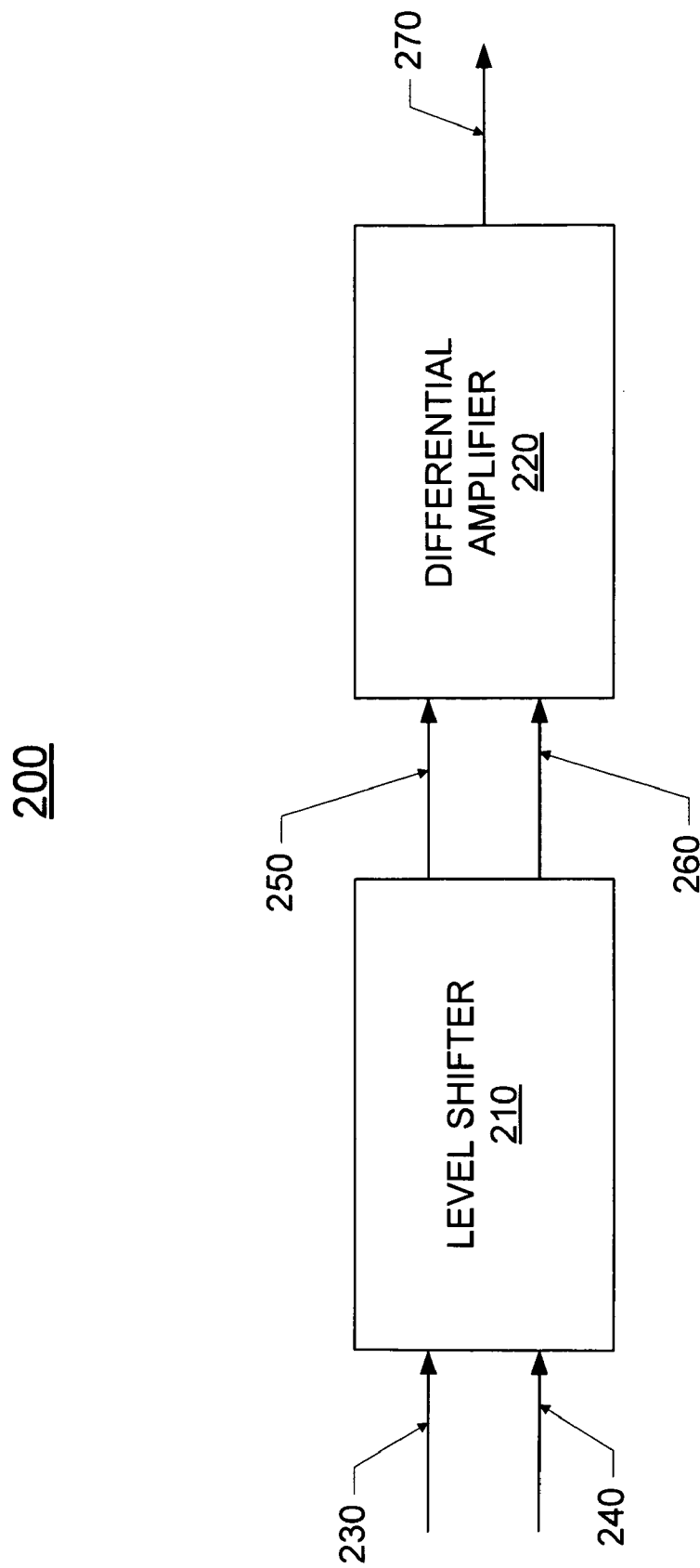
FIG. 2 is a block diagram illustrating a wide input common mode sense amplifier.

According to embodiments of the subject matter disclosed in this application, a rail-to-rail input common mode sense amplifier may be achieved. FIG. 2 shows a block diagram of such a sense amplifier 200. Sense amplifier includes two stages, a level shifter 210 and a differential amplifier 220. The first stage (level shifter 210) takes a pair of differential input voltages, 230 and 240. The level shifter comprises a differential amplifier from which the voltage headroom constraint imposed by the current sources is removed. As a result, the level shifter has a rail-to-rail input common-mode voltage range. The level shifter produces a pair of differential output voltages (250 and 260) corresponding to input voltages 230 and 240. Differential output voltages 250 and 260 have an almost constant common-mode voltage. However, removing the voltage headroom imposed by the current sources from the differential amplifier in the level shifter causes the gain and signal swing of the level shifter to suffer. Thus, it is desirable that measures be taken to ensure that the level shifter has at least unity gain so that the second stage does not have too much burden to compensate for any gain loss or in-die variation offset voltage amplification caused by the first stage.

The second stage (differential amplifier 220) takes output voltages 250 and 260 from the level shifter as its differential input voltages. Differential amplifier 220 provides high gain amplification and performs differential output to single ended output conversion. Differential amplifier 220 provides a final output 270. The common mode voltage of 250 and 260 is held constantly at approximately one third of Vcc. Thus, a PSDA is a good choice to provide high gain amplification for 250 and 260 in the second stage. Because the common mode voltage of differential input voltages of the second stage is stable, there is no need for the second stage to have a wide input common-mode range.

As many other sense amplifiers, sense amplifier 200 is not completely immune from the impact of in-die variations resulting from even state-of-the-art semiconductor processing technologies. However, with separated level shifting stage and amplification stage, sense amplifier 200 provides a design with much better performance against random in-die process variation than currently available rail-to-rail common-mode sense amplifiers. The random in-die variation impact can be mitigated by using high gain amplifiers for the amplification stage and by using a proper size of the level shifting stage. In general, using transistors with a long channel length and width for the level shifter stage helps reduce the effects of in-die variations.

Figure 3:
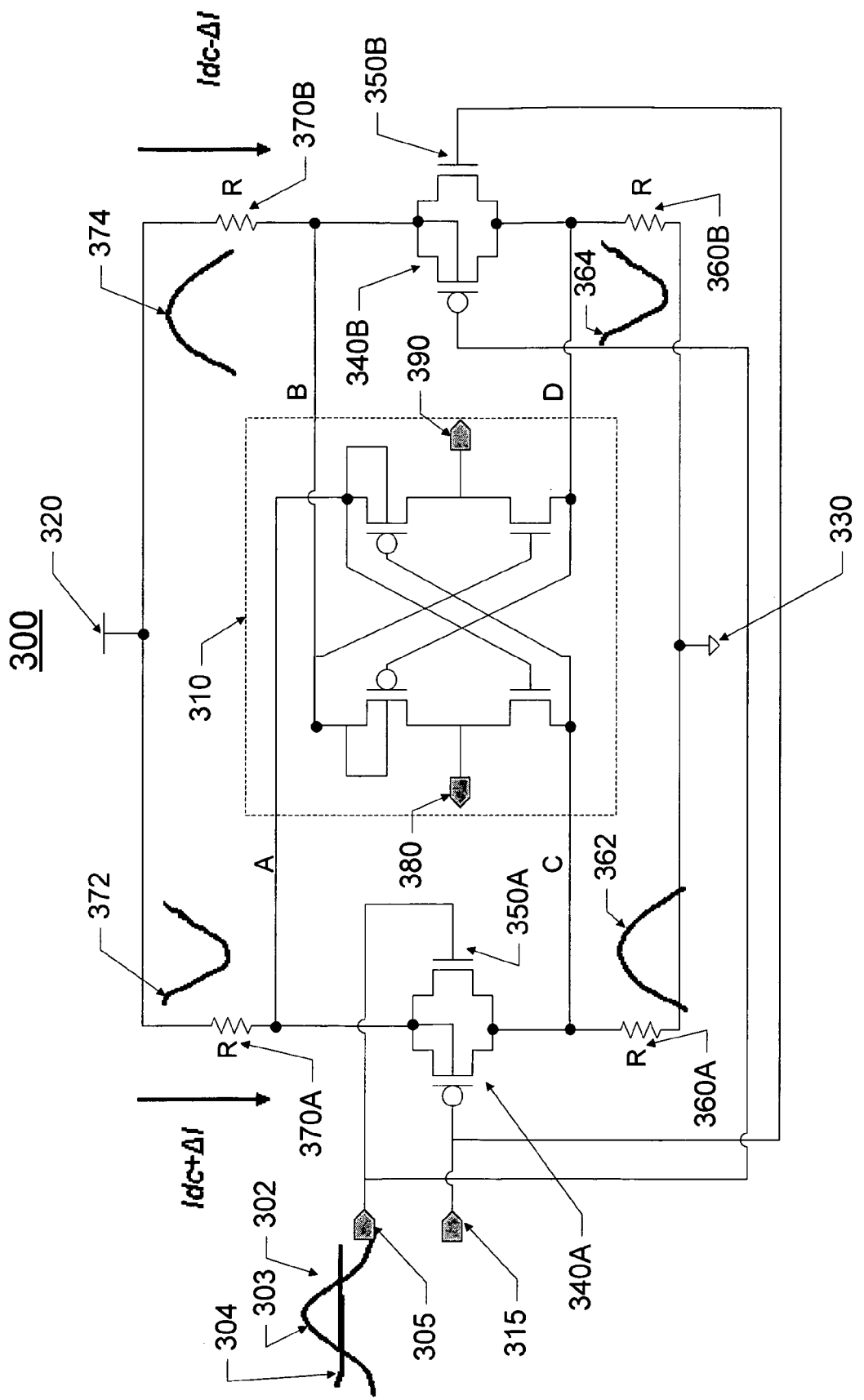
FIG. 3 depicts a circuit schematic for a level shifter in a wide input common mode sense amplifier.

FIG. 3 is a schematic of an example circuit 300 for the level shifter stage of a wide input common mode sense amplifier as shown in FIG. 2. PMOSFETs 340A and 340B, and NMOS-FETs 350A and 350B, altogether, form CMOS differential pair that accepts an input differential signal 305 and 315. Loads 370A and 370B are coupled to Vcc (320) at one end. At the other end, load 370A is coupled to drains of MOSFETs 340A and 350A; and load 370B is coupled to drains of MOSFETs 340B and 350B. Loads 360A and 360B are coupled to Vss (330) at one end. At the other end, load 360A is coupled to sources of MOSFETs 340A and 350A; and load 360B is coupled to sources of MOSFETs 340B and 350B. Loads 360A, 360B, 370A, and 370B are implemented using linear MOSFET resistors.

Figure 4:
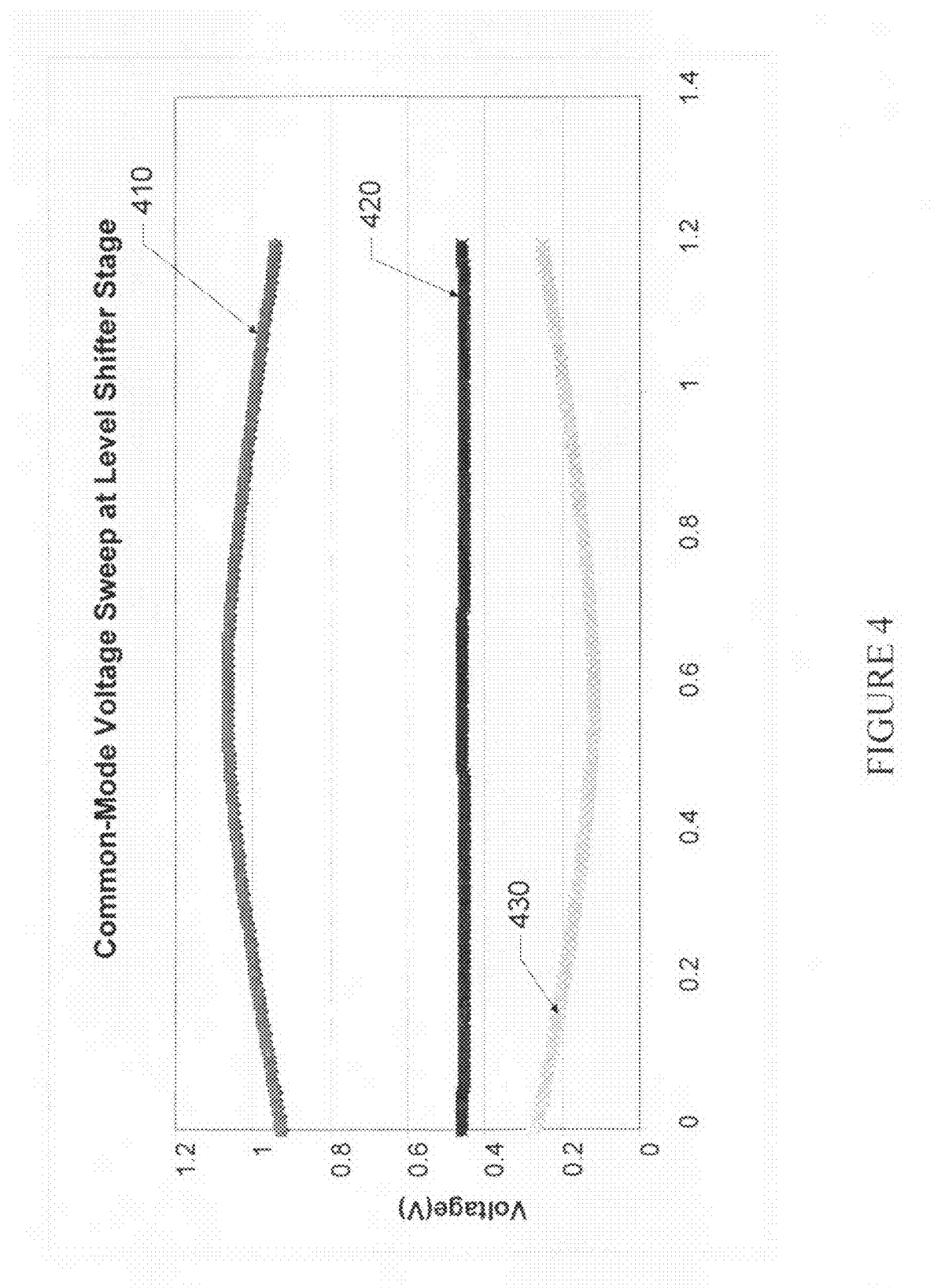
FIG. 4 is a diagram illustrating common mode voltage sweep at the level shifter stage of a wide input common mode sense amplifier.

The operation of circuit 300 is as follows. The current (Idc) through identical branches (i.e., branch 1: Vcc 370A 340A and 350A 360A Vss and branch 2: Vcc 370B 340B and 350B 360B Vss) cancels out each other when both inputs 305 and 315 have equal potentials as illustrated by 304 in waveform 302. When inputs 305 and 315 do not have equal potentials, a non-zero differential of inputs 305 and 315 is present as illustrated by 303 and 304 respectively in waveform 302. As a result, an alternate current ("AC") current component ($\Delta I$) is introduced in both branch 1 and branch 2, but $\Delta I$ flows in counter opposite direction in these two branches as illustrated by waveforms 362, 364, 372 and 374. Loads 360A, 360B, 370A, and 370B detect $\Delta I$ as four output voltages at points A, B, C and D. The voltage drops across the input transistors $V_{A-C}$ and $V_{B-D}$ in common mode operation are kept relatively constant, following the pass gate characteristics, as shown in FIG. 4. In one embodiment, the value (R) of loads 360A, 360B, 370A, and 370B may be made the same. In another embodiment, these loads may have different values. In general, the value of these loads needs to be high enough to provide sufficient voltage swing (gain), but not too high. If the load value is too high, it may result in reducing the overdrive voltage (Vgs−Vt) to the next stage 310, thus causing large gain degradation.

Four voltage outputs at points A, B, C, and D are then fed to a voltage divider circuit 310. The voltage divider circuit converts the 4 terminal level shifted voltages to 2 terminal level shifted differential signals 380 and 390, which are then fed into the high gain differential amplifier stage. The voltage divider also helps shift the common-mode voltage of the input signals to a stable (generally constant) common-mode voltage of output differential signals 380 and 390.

The function of the level shifter stage is to shift the common-mode voltage of the input signals, which could have a wide rail-to-rail range, to a common mode voltage with a nearly constant desired common-mode level. Regardless of the common mode ranges of input signals 305 and 315, the common mode voltage of output differential signals 380 and 390 is determined by loads 360A, 360B, 370A, and 370B, and by voltage divider circuit 310. For example, if the level shifter circuit is designed to be balanced, i.e., the four loads (360A, 360B, 370A, and 370B) are of the same value and the PMOS and NMOS devices in the voltage divider circuit have the same strength, the common-mode voltage of output signals 380 and 390 will be in the middle of the rail-to-rail range.

FIG. 4 is a diagram illustrating common mode voltage sweep at the level shifter stage as shown in FIG. 3. The x-axis shows common mode voltage of two input signals 305 and 315. The y-axis shows common mode voltage of output signals include intermediate output signals at points A, B, C, and D. Line 410 illustrates how the common mode voltage of intermediate output voltages at points A and B changes with the common mode voltage of the input signals. Line 430 illustrates how the common mode voltage of intermediate output voltages at points C and D changes with the common mode voltage of the input signals. It can be seen that the common mode voltages of intermediate output voltages at points A, B, C, and D is not stable when the common mode voltage of the input signals changes. However, the common mode voltage of the final output signals (380 and 390) remains almost constant regardless of common mode voltage changes of the input signals.

Figure 5:
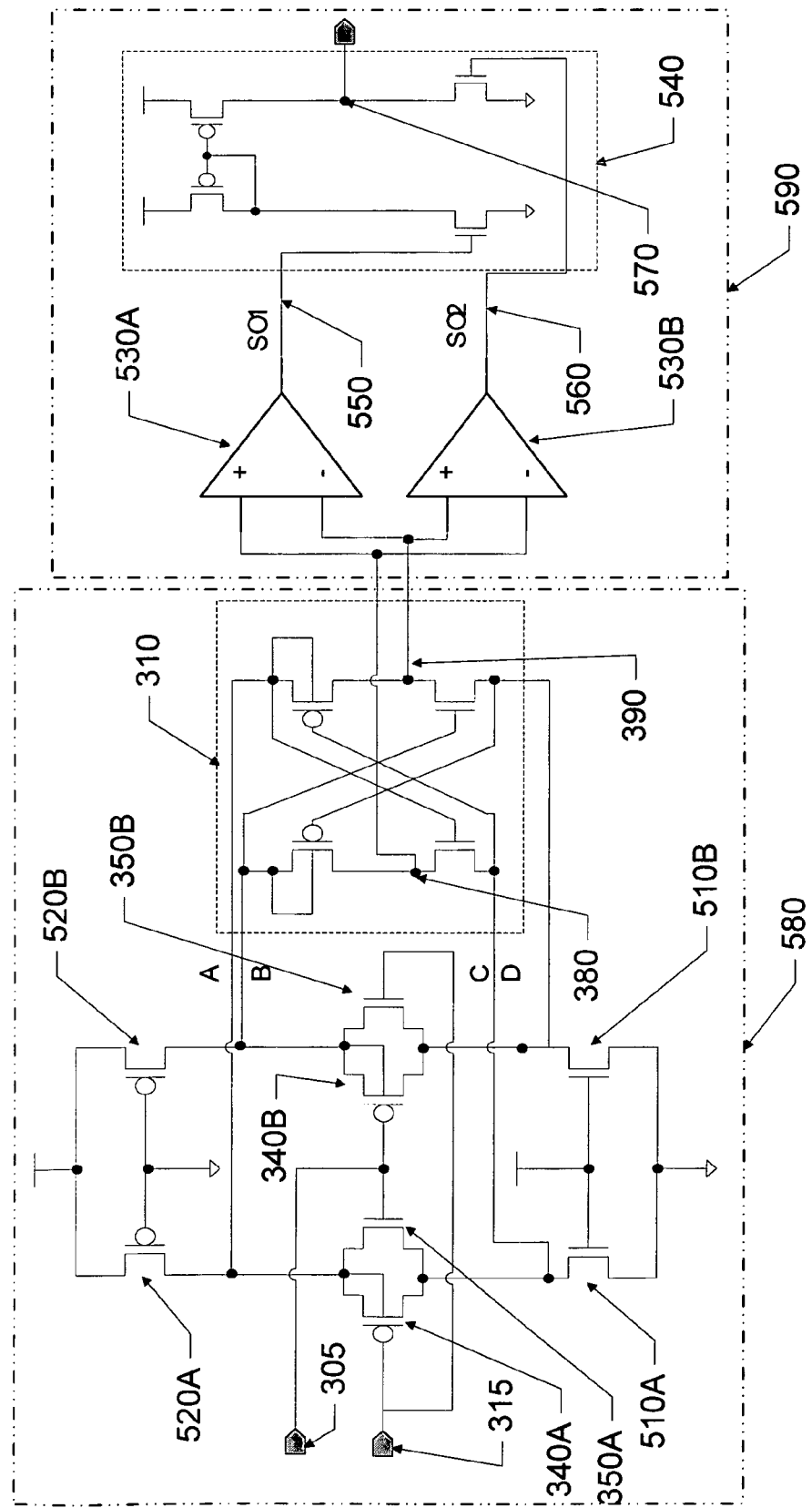
FIG. 5 depicts a circuit schematic for a wide input common mode sense amplifier.

FIG. 5 is a schematic of an example circuit 500 for a wide input common mode sense amplifier as shown in FIG. 2. Circuit 500 includes two parts: part 580 representing the level shifter stage and part 590 representing the differential amplifier stage. The part for the level shifter stage is very similar to circuit 300 as shown in FIG. 3. However, loads 360A and 360B in FIG. 3 are implemented using NMOSFETs 510A and 510B in FIG. 5, respectively; and loads 370A and 370B are implemented using PMOSFETs 520A and 520B in FIG. 5, respectively.

The part of circuit 500 that represents the second stage of the wide input common mode sense amplifier comprises two PSDA 530A and 530B and an output converter 540. Because the level shifter stage does not have much gain, two PSDAs are used in the second stage to achieve high gain for the input signals. PSDAs 530A and 530B accept the differential output signals (380 and 390) from the level shifter stage. Since the common mode voltage of the first stage output signals (380 and 390) is constant, PSDAs 530A and 530B can be set to achieve high gain without worrying about possible distortions due to the input PSDA common mode voltage not held constant. The output converter (540) includes an NSDA which converts two terminal output signals (550 and 560) into a single terminal output signal 570.

Figure 6:
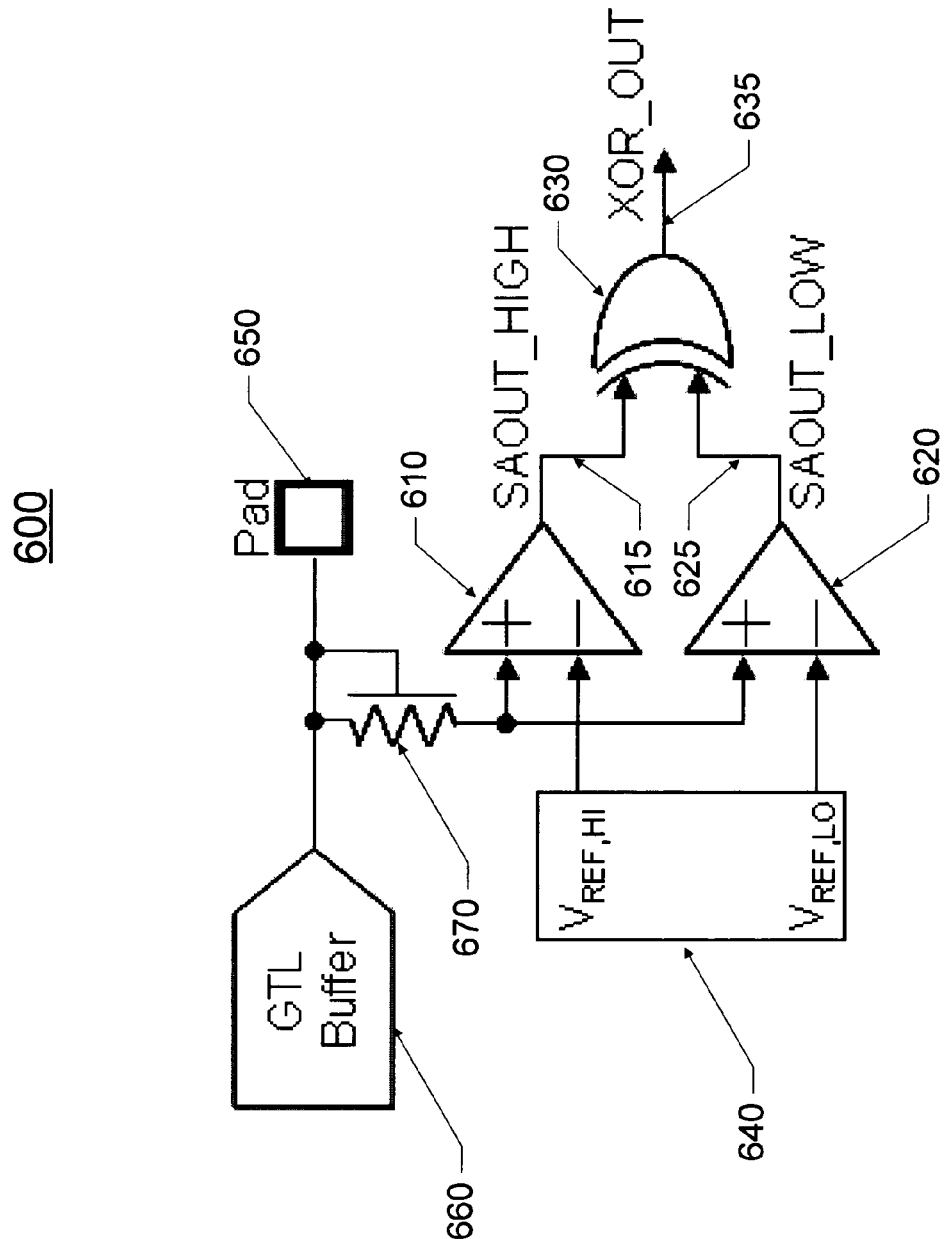
FIG. 6 is a diagram of an example apparatus for measuring delay between two discrete time events using wide input common mode sense amplifiers.

FIG. 6 is a diagram of an example apparatus 600 for measuring delay between two discrete time events using wide input common mode sense amplifiers as illustrated in FIG. 2. Apparatus 600 comprises two sense amplifiers 610 and 620, a XOR gate 630, and a reference voltage setting logic 640. GTL buffer 660 is a Gunning Transceiver Logic Terminated ("GTL") type bus buffer and is used to show an example differential amplifier input buffer, which does not require that a GTL buffer be used. Buffer 660 may provide an input signal to both sense amplifier 610 and 620. Pad 650 may be used as an access point to the input signal from buffer 660. Resistor 670 may be used to adjust the magnitude of the input signal before the signal is sent to sense amplifiers.

A wide input common mode sense amplifier as illustrated in FIG. 2 and described above may be used for sense amplifiers 610 and 620. Two discrete events may be detected using two different voltages in a general voltage signal. For example, assume that the two discrete events are event A and event B and a general voltage signal has two different voltage thresholds $V_A$ and $V_B$. When the value of the voltage signal is larger than $V_A$, one can say that event A occurs; and when the value of the voltage signal is large than $V_B$, one can say the event B occurs. If the voltage signal is continuous, one can detect when event A occurs, when event B occurs, and time intervals between event A and event B.

Reference voltage setting logic 640 may set two reference voltages for two discrete events. The two reference voltages each may be used as one input to a sense amplifier. In the above example, $V_A$ and $V_B$ may be used as two reference voltages. $V_A$ may be used as one input to sense amplifier 610, and $V_B$ may be used as one input to sense amplifier 620. The general voltage signal is used as the other input to both sense amplifiers 610 and 620. Thus, when event A occurs, the general voltage signal is larger than $V_A$, sense amplifier 610 flips and its output 615 turns from low to high; and when event B occurs, the general voltage signal is larger than $V_B$, sense amplifier 620 flips and its output 625 turns from low to high. XOR 630 accepts outputs 615 and 625 and produces a pulse signal output 635 whose pulse width corresponds to the time intervals between the two discrete events (e.g., event A and event B). $V_A$ and $V_B$ in this example may correspond to $V_{REF,HI}$ and $V_{REF,LO}$ in FIG. 6, respectively.

Figure 7:
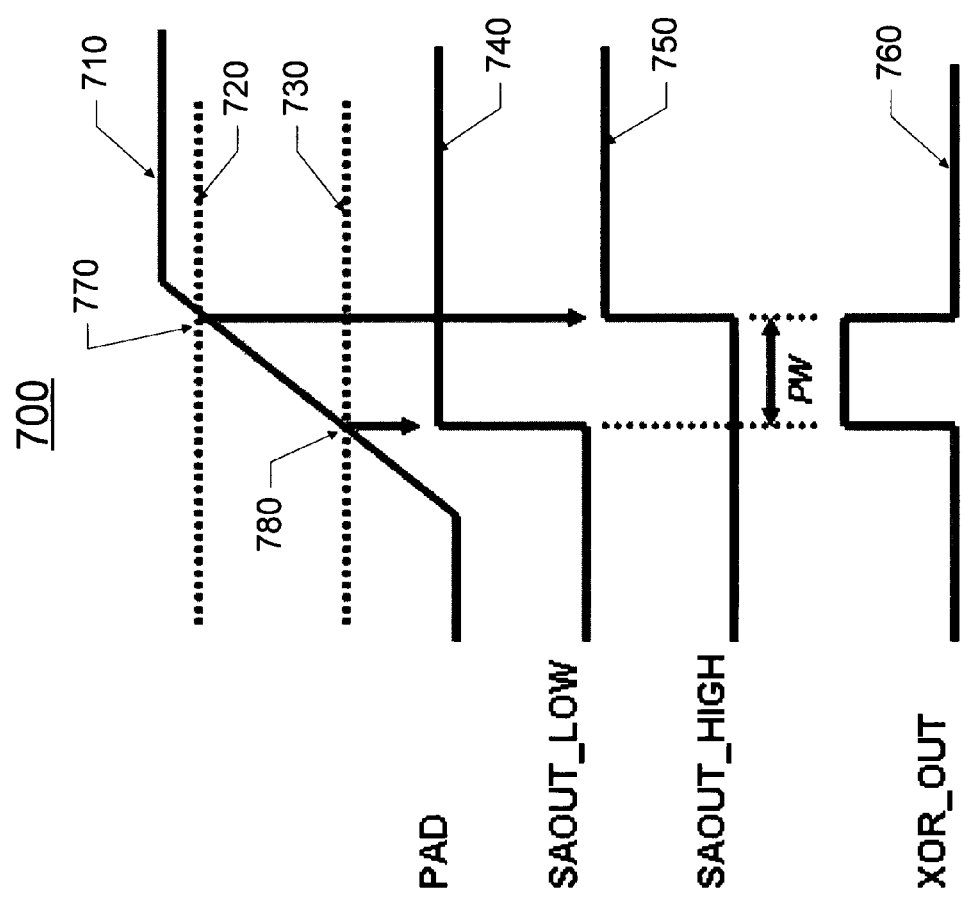
FIG. 7 depicts example waveforms illustrating how the example apparatus in FIG. 6 may be used to measure edge rate of a signal.

The operation of apparatus 600 shown in FIG. 6 may be better illustrated by an example 700 illustrated by FIG. 7. Example 700 depicts waveforms illustrating how apparatus 600 may be used to measure edge rate of a signal. $V_{REF,HI}$ and $V_{REF,LO}$ in FIG. 6 correspond to line 720 and line 730 respectively. Waveform 710 represents the signal whose edge rate is to be measured. Waveform 740 represents the output signal (625) from sense amplifier 620. Waveform 750 represents the output signal (615) from sense amplifier 610. Waveform 760 represents the output signal (635) of XOR 630.

When the level of the signal rises to be just over $V_{REF,LO}$ at point 780, output signal 625 from sense amplifier 620 turns from low to high. When the level of the signal continues to rise to be just over $V_{REF,HI}$ at point 770, output signal 615 from sense amplifier 610 turns from low to high. XOR 630 uses output signals 615 and 625 as input and produces an output signal 635 with a pulse whose width corresponds to the time interval between points 770 and 780. By measuring the width of the pulse in waveform 760, the edge rate of the signal may be determined.

For sense amplifiers 610 and 620 to actually measure delay of two discrete time events, it is desirable that these sense amplifiers have a very wide input common mode voltage range. Any performance impact of the sense-amplifier due to different common-mode will result in an error in measuring the delay between the two discrete events.

Figure 8:
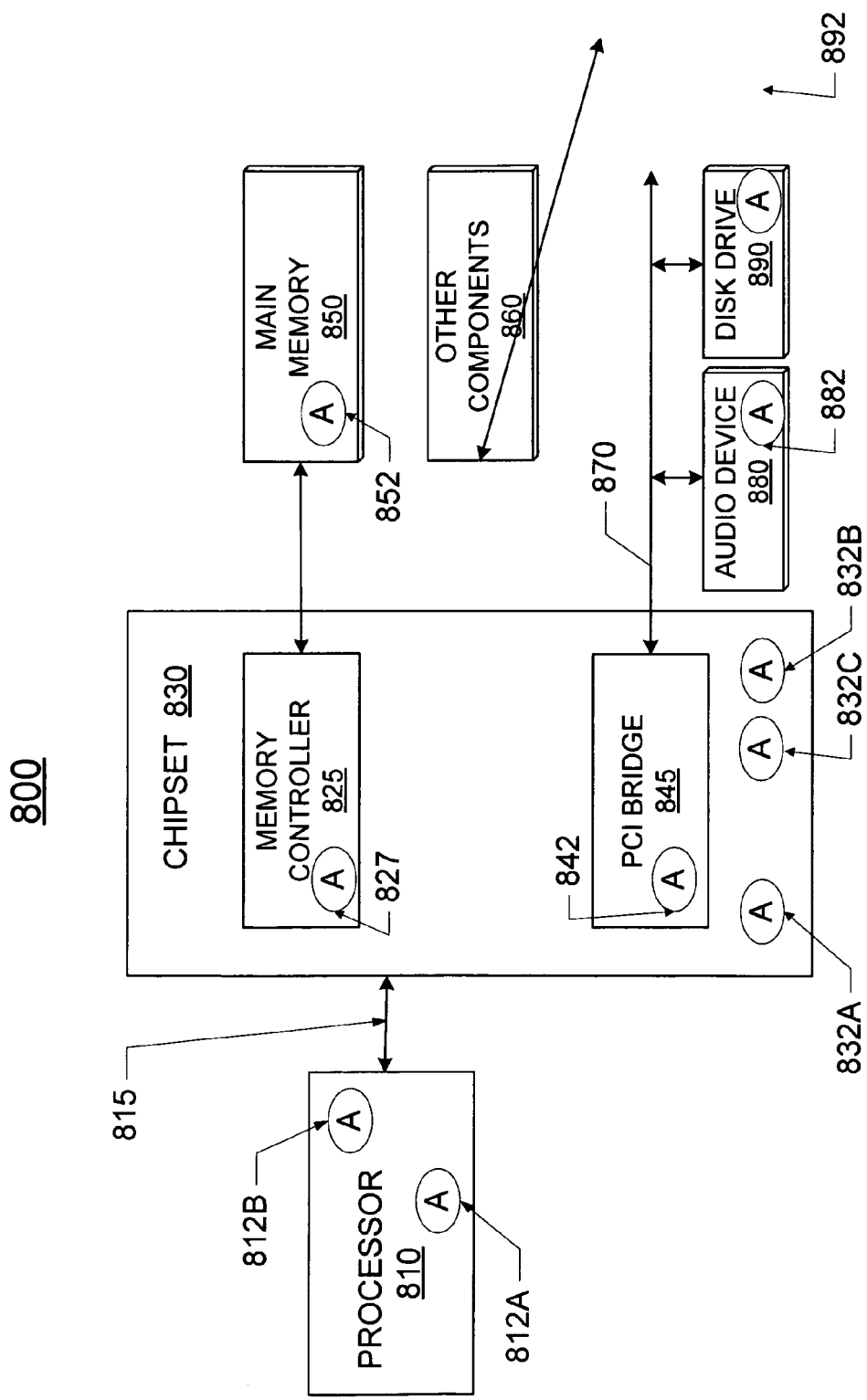
FIG. 8 is a block diagram of a computing system including at least one wide input common mode sense amplifier in integrated circuits inside the system.

FIG. 8 is a block diagram of a computing system 800 including at least one wide input common mode sense amplifiers in integrated circuits inside the system. Computing system 800 may comprise one or more processors 810 coupled to a system interconnect 815. Each processor may further include one or more processing cores. The computing system 800 may also include a chipset 830 coupled to the system interconnect 815. Chipset 830 may include one or more integrated circuit packages or chips. Chipset 830 may comprise one or more device interfaces 835 to support data transfers to and/or from other components 860 of the computing system 800 such as, for example, BIOS firmware, keyboards, mice, storage devices, network interfaces, etc. Chipset 830 may be coupled to a Peripheral Component Interconnect (PCI) bus 870. Chipset 830 may include a PCI bridge 845 that provides an interface to the PCI bus 870. The PCI Bridge 845 may provide a data path between the processor 810 as well as other components 860, and peripheral devices such as, for example, an audio device 880 and a disk drive 890. Although not shown, other devices may also be coupled to the PCI bus 870.

Additionally, chipset 830 may comprise a memory controller 825 that is coupled to a main memory 850. The main memory 850 may store data and sequences of instructions that are executed by the processor 810 or any other device included in the system. The memory controller 825 may access the main memory 850 in response to memory transactions associated with the processor 810, and other devices in the computing system 800. In one embodiment, memory controller 850 may be located in processor 810 or some other circuitries. The main memory 850 may comprise various memory devices that provide addressable storage locations which the memory controller 825 may read data from and/or write data to. The main memory 850 may comprise one or more different types of memory devices such as Dynamic Random Access Memory (DRAM) devices, Synchronous DRAM (SDRAM) devices, Double Data Rate (DDR) SDRAM devices, or other memory devices.

Any integrated circuit ("IC") inside computing system 800 may include one or more sense amplifier with a wide common mode voltage range as disclosed above. For example, processor 810 may include sense amplifiers 812A and 812B; chipset 830 may include sense amplifiers 832A, 832B, and 832C; memory controller may include a sense amplifier 827; PCI bridge 845 may include a sense amplifier 842; main memory 850 may include a sense amplifier 852; audio device 880 may include a sense amplifier 882; and disk drive 890 may include a sense amplifier 892. These sense amplifiers may be used basic building blocks for an IC. They may be used to measure delay of two discrete time events. They may also be used to detect voltage changes of any kind.

Although an example embodiment of the disclosed subject matter is described with reference to block and flow diagrams in FIGS. 1-8, persons of ordinary skill in the art will readily appreciate that many other methods of implementing the disclosed subject matter may alternatively be used. For example, some of the blocks in block diagrams described may be changed, eliminated, or combined.

In the preceding description, various aspects of the disclosed subject matter have been described. For purposes of explanation, specific numbers, systems and configurations were set forth in order to provide a thorough understanding of the subject matter. However, it is apparent to one skilled in the art having the benefit of this disclosure that the subject matter may be practiced without the specific details. In other instances, well-known features, components, or modules were omitted, simplified, combined, or split in order not to obscure the disclosed subject matter.

While the disclosed subject matter has been described with reference to illustrative embodiments, this description is not intended to be construed in a limiting sense. Various modifications of the illustrative embodiments, as well as other embodiments of the subject matter, which are apparent to persons skilled in the art to which the disclosed subject matter pertains are deemed to lie within the scope of the disclosed subject matter.

What is claimed is:

1. An amplifier, comprising:
    a level shifter stage to accept a pair of input signals with a common mode voltage in a rail-to-rail range and to produce a pair of output signals with a common mode voltage of a certain value; and
    an amplifier stage to amplify said pair of output signals from said level shifter stage to produce a single terminal output signal, wherein the level shifter stage includes:
    a first part to accept said pair of input signals with a common mode voltage in said rail-to-rail range and to produce four terminal output signals; and
    a second part to convert said four terminal output signals to said pair of output signals with a common mode voltage of said certain value.

2. The amplifier of claim 1, wherein said first part comprises a rail-to-rail input common mode differential amplifier.

3. The amplifier of claim 2, said rail-to-rail input common mode differential amplifiers comprises a CMOS differential amplifier, said CMOS differential amplifier including four active loads.

4. The amplifier of claim 3, wherein said certain value of the common mode voltage of said pair of output signals from said level shifter stage is determined at least in part by values of said active loads in said CMOS differential amplifier and strength of transistors used in said second part of said level shifter stage.

5. The amplifier of claim 1, wherein said amplifier stage comprises:
    at least one high gain differential amplifier to amplify said pair of output signals from said level shifter stage to produce a pair of amplified output signals; and
    an output converter to convert said pair of amplified output signals to said single terminal output signal.

6. The amplifier of claim 5, wherein said at least one high gain differential amplifier comprises a PMOS input self-biased differential amplifier, said PMOS input self-biased differential amplifier having high gain.

7. The amplifier of claim 5, wherein said output converter comprises a self-biased differential amplifier.

8. The amplifier of claim 1, wherein said level shifter stage is separated from said amplifier stage in the die: of said amplifier, and said level shifter stage is sized to reduce the impact of random in-die variations.

9. An integrated circuit including a rail-to-rail input common mode differential amplifier, said to rail-to-rail input common mode differential amplifier comprising:
    a level shifter stage to accept a pair if input signals with a common mode voltage in a rail-to-rail range and to produce a pair of output signals with a common mode voltage of certain value; and
    an amplifier stage to amplify said pair of output signals from said level shifter stage to produce a single terminal output signal, wherein said level shifter stage includes:
    a first part to accept said pair of input signals with a common mode voltage in said rail-to-rail range and to produce four terminal output signals; and
    a second part to convert said four terminal output signals to said pair of output signals with a common mode voltage of said certain value.

10. The integrated circuit of claim 9, wherein said amplifier stage comprises:
    at least one high gain differential amplifier to amplify said pair of output signals from said level shifter stage to produce a pair of amplified output signals; and
    an output converter to convert said pair of amplified output signals to said single terminal output signal.

11. The integrated circuit of claim 9, wherein said level shifter stage is separated from said amplifier stage in the die of said amplifier, and said level shifter stage is properly sized to reduce the impact of random in-die variations.

12. The integrated circuit of claim 9, wherein said integrated circuit comprises a circuit selected from the group including a processor, a memory, a memory controller, a chip set, an application specific integrated circuit, and a communications device.

13. A computing system, comprising:
    synchronous dynamic random access memory ("SDRAM"); and
    a processor coupled to access said SDRAM, said processor having a rail-to-rail input common mode differential amplifier, said rail-to-rail input common mode differential amplifier comprising:
    a level shifter stage to accept a pair of input signals with a common mode voltage in a rail-to-rail range and to produce a pair of output signals with a common mode voltage of a certain value; and
    an amplifier stage to amplify said pair of output signals from said level shifter stage to produce a single terminal output signal, wherein said level shifter stage includes:
    a first part to accept said pair of input signals with a common mode voltage in said rail-to-rail range and to produce four terminal output signals; and
    a second part to convert said four terminal output signals to said pair of output signals with a common mode voltage of said certain value.

14. The computing system of 13, wherein said amplifier stage comprises:
- at least one high gain differential amplifier to amplify said pair of output signals from said level shifter stage to produce a pair of amplified output signals; and
- an output converter to convert said pair of amplified output signals to said single terminal output signal.

15. The amplifier of claim 1, further comprising:
- a second level shifter stage coupled to a second amplifier stage, said first pair of input signals to said first level shifter stage being a first event line and a reference voltage to detect a first event, a second pair of input signals to said second level shifter being a second event line and a second reference voltage to detect a second event; and
- an XOR gate to accept output signals from said first amplifier stage and said second amplifier stage, and to produce a pulse signal with a pulse, said pulse having a width corresponding to delay between said first event and said second event.

16. The apparatus of claim 15, further comprising reference voltage setting logic to set said first input reference voltage of said first level shifter stage and said second input reference voltage of said second level shifter stage.

17. The apparatus of claim 16, wherein said first level shifter stage and amplifier stage comprise a first sense amplifier that detects said first event when the voltage of an input signal is larger than said first reference voltage; and said second level shifter stage and said second amplifier stage comprise a second sense amplifier that detects said second event when the voltage of said input signal is larger than said second reference voltage.

18. The integrated circuit of claim 9, further comprising:
- a second rail-to-rail input common mode differential amplifier, said first pair of input signals to said first rail-to-rail input common mode differential amplifier being a first event line and a reference voltage to detect a first event, a second pair of input signals to said second rail-to-rail input common mode differential amplifier being a second event line and a second reference voltage to detect a second event; and
- an XOR gate to accept output signals from said first rail-to-rail input common mode differential amplifier and said second rail-to-rail input common mode differential amplifier, and to produce a pulse signal with a pulse, said pulse having a width corresponding to delay between said first event and said second event.

19. The apparatus of claim 18, further comprising reference voltage setting logic to set said first input reference voltage of said first rail-to-rail input common mode differential amplifier and said second input reference voltage of said second rail-to-rail input common mode differential amplifier.

20. The apparatus of claim 19, wherein said first rail-to-rail input common mode differential amplifier detects said first event when the voltage of an input signal is larger than said first reference voltage; and said second rail-to-rail input common mode differential amplifier detects said second event when the voltage of said input signal is larger than said second reference voltage.

21. The computing system of claim 13, wherein the said pair of input signals to said rail-to-rail input common mode differential amplifier are a first event line and a reference voltage to detect an event, the computing system further comprising a logic gate to produce a signal indicating a timing of the event.

* * * * *